United States Patent
Han et al.

(10) Patent No.: US 7,626,875 B2
(45) Date of Patent: Dec. 1, 2009

(54) MULTI-WORDLINE TEST CONTROL CIRCUIT AND CONTROLLING METHOD THEREOF

(75) Inventors: Hi-Hyun Han, Ichon (KR); Jee-Yul Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/962,026

(22) Filed: Dec. 20, 2007

(65) Prior Publication Data

US 2008/0279021 A1    Nov. 13, 2008

(30) Foreign Application Priority Data

May 11, 2007   (KR)   ............... 10-2007-0046228

(51) Int. Cl.
    *G11C 29/00*   (2006.01)
    *G11C 8/00*    (2006.01)
(52) U.S. Cl. .............. 365/201; 365/230.03; 365/230.06
(58) Field of Classification Search ............... 365/201
    See application file for complete search history.

(56) References Cited

U.S. PATENT DOCUMENTS

| | | | |
|---|---|---|---|
| 5,432,744 A * | 7/1995 | Nagata | 365/201 |
| 5,864,510 A | 1/1999 | Nakaoka | |
| 6,166,967 A * | 12/2000 | Do | 365/189.07 |
| 6,292,421 B1 * | 9/2001 | Shore et al. | 365/222 |
| 6,512,692 B2 * | 1/2003 | Yamauchi et al. | 365/185.11 |
| 6,546,512 B1 | 4/2003 | Ochoa et al. | |
| 7,154,808 B2 * | 12/2006 | Shim | 365/230.04 |
| 7,379,370 B2 * | 5/2008 | Mori | 365/222 |
| 2003/0188238 A1 | 10/2003 | Partsch et al. | |
| 2005/0213397 A1 | 9/2005 | Santin | |
| 2006/0123291 A1 | 6/2006 | Kim | |
| 2008/0159029 A1 * | 7/2008 | Park | 365/201 |

FOREIGN PATENT DOCUMENTS

| | | |
|---|---|---|
| KR | 1019980005059 | 3/1998 |
| KR | 1020000065431 A | 11/2000 |
| KR | 1020020006091 A | 1/2002 |
| KR | 1020030086800 A | 11/2003 |

* cited by examiner

*Primary Examiner*—Son L Mai
(74) *Attorney, Agent, or Firm*—Baker & McKenzie LLP (57) ABSTRACT

A multi-wordline test control circuit in a semiconductor integrated device for performing a multi-wordline test in a specified cell mat among a plurality of cell mats. The multi-wordline test control circuit comprises a multi-test control block for receiving a multi-wordline test signal and outputting a first test signal and a second test signal, and a multi-wordline test block for performing the multi-wordline test in a specified cell mat among a plurality of cell mats in response to the first test signal and the second test signal.

25 Claims, 8 Drawing Sheets

[FIG. 1]

PRIOR ART

MULTI-WORDLINE TEST CONTROL CIRCUIT AND CONTROLLING METHOD THEREOF

CROSS-REFERENCE TO RELATED PATENT APPLICATION

This application claims the benefit under 35 U.S.C. 119(a) of Korean Patent Application No. 10-2007-0046228, filed on May 11, 2007, in the Korean Intellectual Property Office, the disclosure of which is incorporated herein in its entirety by reference as if set forth in full.

BACKGROUND

1. Technical Field

The embodiments described herein relate to a semiconductor integrated circuit, and more particularly, to a wordline test control circuit for inclusion in a semiconductor integrated circuit and a wordline testing method thereof.

2. Related Art

Figure 1:
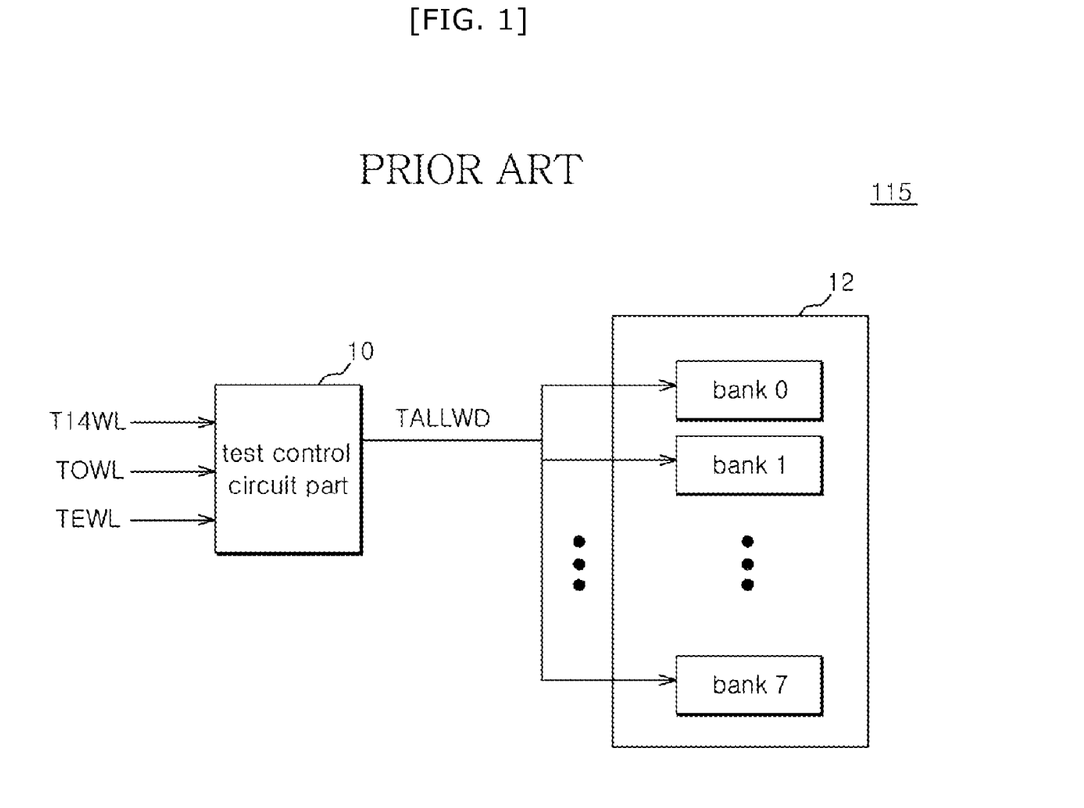
FIG. 1 is a block diagram illustrating a conventional multi-wordline test control circuit.

Referring to FIG. 1, a conventional wordline test control circuit 115 comprises a test control circuit 10 interfaced with a plurality of memory banks within a memory array 12. The test control circuit 10 receives as inputs a ¼ wordline test signal 'T14WL', an even wordline test signal 'TEWL' or an odd wordline test signal 'TOWL', and generates a test control signal 'TALLWD', which is enabled during a test mode. There are three test modes in this example, a ¼ wordline test, an even wordline test, or an odd wordline test, and therefore during each the test control signal 'TALLWD' is enabled.

Each of the memory banks 0, 1, . . . 7 can receive the test control signal 'TALLWD' and in response will activate the appropriate wordlines, in order to perform a ¼ wordline test, an even wordline test, or an odd wordline test.

In the ¼ wordline test, the control signal 'TALLWD' is sent to all the banks 0, 1, . . . 7. Accordingly, when a test control signal is enabled, ¼ of the wordlines of the respective banks 0, 1, . . . 7 are simultaneously enabled. This causes a noticeable increase in power consumption. Also, in the ¼ wordline test, because all mats in each bank 0, 1, . . . 7 perform the ¼ wordline test, power consumption is further increased.

Moreover, in a conventional wordline test control circuit 115, after ¼ of the wordlines of the banks 0, 1, . . . 7 are enabled, the next ¼ of the wordlines are enabled and so on until all wordlines have been tested. During this period, all previously enabled wordlines are maintained in the enabled state. In other words, only when the test mode is ended, are the wordlines disabled. This further increases power consumption and also generates noise. In fact, the memory banks 0, 1, . . . 7 can actually be damaged as a result, or even destroyed.

SUMMARY

A multi-wordline test control circuit is provided that performs a multi-wordline test in a selected memory bank and in a selected cell mat, which reduces power consumption and controls the test depending upon each of an active mode and a precharging mode.

Still another present invention is to provide a method for controlling a multi-wordline test circuit.

According to one aspect, a multi-wordline test control circuit in a semiconductor integrated circuit, for performing a multi-wordline test comprises a multi-test control block for receiving a multi-wordline test signal and outputting a first test signal and a second test signal and a multi-wordline test block for performing the multi-wordline test in a specified cell mat among a plurality of cell mats, in response to the first test signal and the second test signal.

According to another aspect a method for controlling a multi-wordline test control circuit comprises the steps of generating a first test signal activated when a multi-wordline test signal is activated and a bank active signal is activated, generating a second test signal that is de-activated when the first test signal is activated, receiving some of a plurality of row addresses when the first test signal is activated and generating first address decoding signals, generating second address decoding signals by decoding addresses associated with selection of mats among the row addresses in response to the inactivated second test signal such that only the second address decoding signals, which are inputted to mats corresponding to the addresses associated with selection of mats, are activated, and the second address decoding signals, which are inputted to the other mats, are inactivated; receiving the second address decoding signals and the second test signal and generating wordline off control signals for controlling a wordline driver; and receiving the first address decoding signals and the wordline off control signals and activating wordlines.

According to still another aspect of the present invention, there is provided a multi-wordline test control circuit comprising a first multi-test control block arranged in a first bank and generating multi-wordline test signals for respective cell mats in the first bank in response to a first bank active signal; a first multi-wordline test block arranged in the first bank and driven in response to the multi-wordline test signals for the respective cell mats in the first bank; a second multi-test control block arranged in a second bank and generating multi-wordline test signals for respective cell mats in the second bank in response to a second bank active signal; and a second multi-wordline test block arranged in the second bank and driven in response to the multi-wordline test signals for the respective cell mats in the second bank, wherein a multi-wordline test is performed for selected at least one of the banks or for selected at least one of the cell mats of the banks.

The multi-wordline test block may comprises a row predecoder for receiving row addresses in response to the first test signal and the second test signal to output the first address decoding signals and second address decoding signals; and a wordline driving section for receiving the first address decoding signals and the second address decoding signals in response to the second test signal and driving wordlines.

The wordline driving section may include a row decoder control unit for receiving the second address decoding signals in response to the second test signal and generating a plurality of wordline control signals; and a row decoder for receiving the first address decoding signals and a partial output of the row decoder control unit and driving wordline signals through decoding and driving.

The row decoder control unit may include a first control unit for receiving the second address decoding signals, a normal row enable signal, a redundancy row enable signal and an address decoding signal in response to the second test signal and generating normal mat select signals, mat select bitline equalization signals and mat select signals; and a second control unit for receiving the mat select signals, a first precharge signal, a second precharge signal and the normal mat select signals in response to the second test signal and generating the wordline off control signals, the row decoder enable signals and the main wordline enable signals.

The second control unit may include first precharging controller for receiving the second precharge signal and the mat select signals; second precharging controller for receiving the first precharge signal, the second test signal and the normal mat select signals; third precharging controller for receiving the second test signal and the first precharge signal; test signal controller for transmitting an output of the first precharging controller in response to the second test signal; inversion delayer for inverting an output of the test signal controller and outputting the wordline off control signals; and row decoder signal generator for receiving an output of the third precharging controller and the output of the test signal controller and outputting the row decoder enable signals.

The second control unit further includes wordline enable signal generator for receiving an output of the second precharging controller and the output of the test signal controller and outputting the main wordline enable signals.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 2:
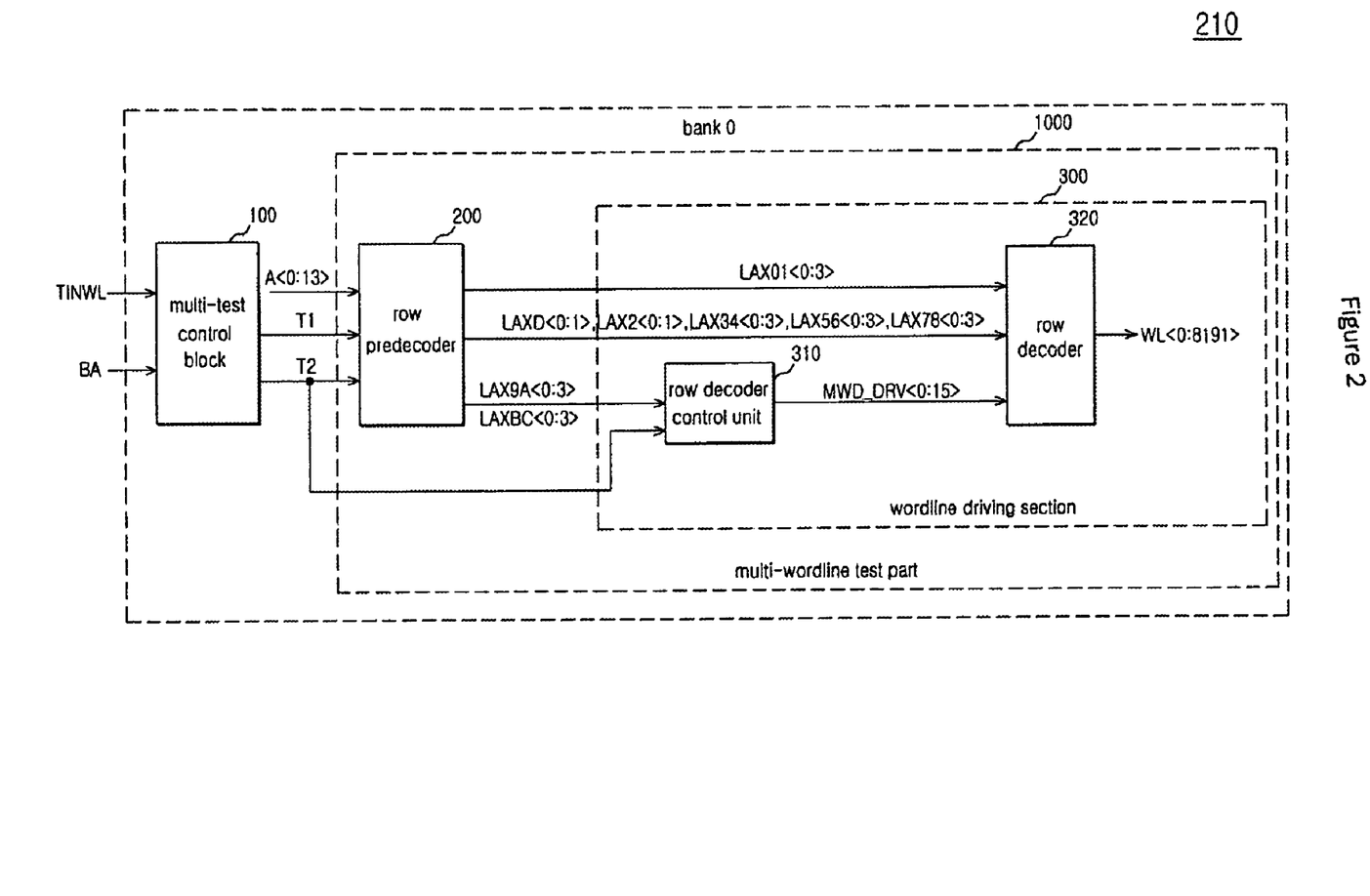
FIG. 2 is a block diagram illustrating an example multi-wordline test control circuit in accordance with one embodiment.

FIG. 2 is a diagram illustrating a multi-wordline test control circuit 210 configured in accordance with one example embodiment. As can be seen, circuit 210 can include a multi-test control block 100 and a multi-wordline test block 1000. The multi-wordline test block 1000 can be configured to receive the outputs 'A<0:13>', 'T1' and 'T2' of the multi-test control block 100 and to perform a multi-wordline test. The multi-wordline test block 1000 can include a row predecoder 200 and a wordline driving section 300.

The multi-test control block 100 can be configured to generate multi-wordline test signals for respective cell mats in response to a multi-wordline test signal 'T1NWL', which simultaneously activates a plurality of wordlines, and a bank active signal 'BA'. The multi-wordline test signals for respective cell mats may include a first test signal 'T1' and a second test signal 'T2'.

In the example of FIG. 2, the circuit 210 can be configured to perform a multi-wordline test for each memory bank. For each memory bank, when the bank active signal 'BA' is enabled, the first test signal 'T1' is also enabled. Also, in order to test only the wordlines of a corresponding mat when performing the multi-wordline test, the second test signal 'T2' can be additionally be included.

Figure 3:
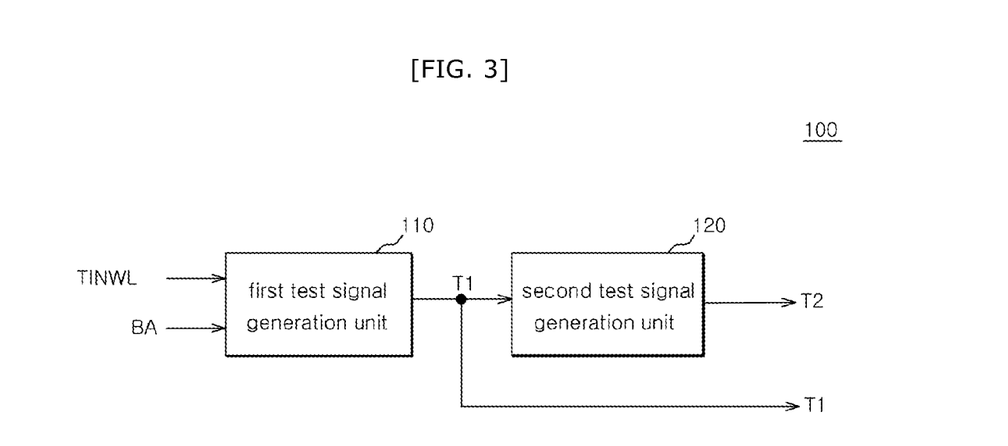
FIG. 3 is a block diagram illustrating in more detail a multi-test control block included in the circuit shown in FIG. 2.

FIG. 3 is a diagram illustrating in more detail an example embodiment of a multi-test control block 100. As can be seen, multi-test control block 100 can include a first test signal generation unit 110 and a second test signal generation unit 120. The first test signal generation unit 110 can be configured to generate the first test signal 'T1' in response to the multi-wordline test signal 'T1NWL' and the bank active signal 'BA'. That is to say, when both the wordline test signal 'T1NWL' and the bank active signal 'BA' are enabled, multi-test block 100 can be configured to generate the first test signal 'T1'.

Figure 4:
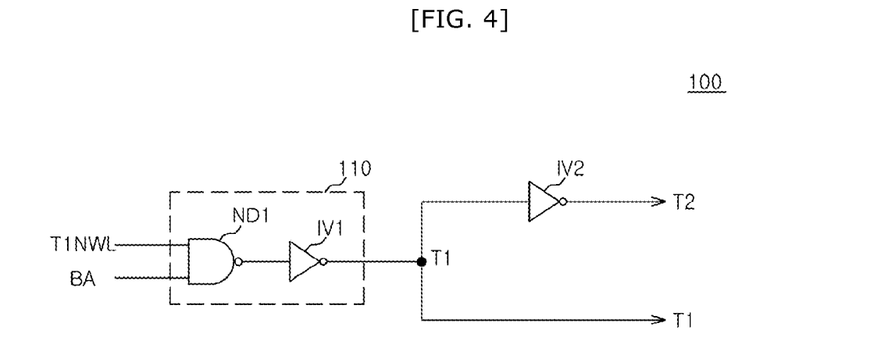
FIG. 4 is a detailed circuit diagram of the multi-test control block of FIG. 3.

Referring to FIG. 4, the first test signal generation unit 110 can comprise a first NAND gate ND1, which receives the multi-wordline test signal 'T1NWL' and the bank active signal 'BA' and a first inverter IV1.

The second test signal generation unit 120 can be configured to generate the second test signal 'T2' using the first test signal 'T1'. The second test signal 'T2' can have a logic level, which is different from that of the first test signal 'T1'. For example, the second test signal generation unit 120 can comprise a second inverter IV2 configured to generate the second test signal 'T2' by inverting the first test signal 'T1'. Thus, if the first test signal 'T1' is at a high level in an active operation, then the second test signal 'T2' will be at a low level. In other embodiments, the second test signal 'T2' can be generated in association with the multi-wordline test signal 'T1NWL'. For example, the second test signal 'T2' can have a low level only when the multi-wordline test signal 'T1NWL' is enabled, or may always have a low level.

Referring again to FIG. 2, the row predecoder 200 can be configured to decode at least some of the bits of row address 'A<0:13>' in response to the first test signal 'T1', and to generate address decoding signals 'LAX2<0:1>', 'LAX34<0:3>', 'LAX56<0:3>', 'LAX78<0:3>' and 'LAXD<0:1>'. The row predecoder 200 can be configured to also decode the bits associated with selection of mats among the bits of the received row address 'A<0:13>' in response to the second test signal 'T2', and to generate further address decoding signals 'LAX9A<0:3>' and 'LAXBC<0:3>'.

In the examples presented herein, address 'A<0:13>' is illustrated as being a 14 bit address; however this is for the sake of convenience only and is not intended to limited the row address to any specific number of bits. Also, the number of bits associated with selection of mats among the row address bits can vary depending upon the application scheme of a particular implementation.

Figure 5:
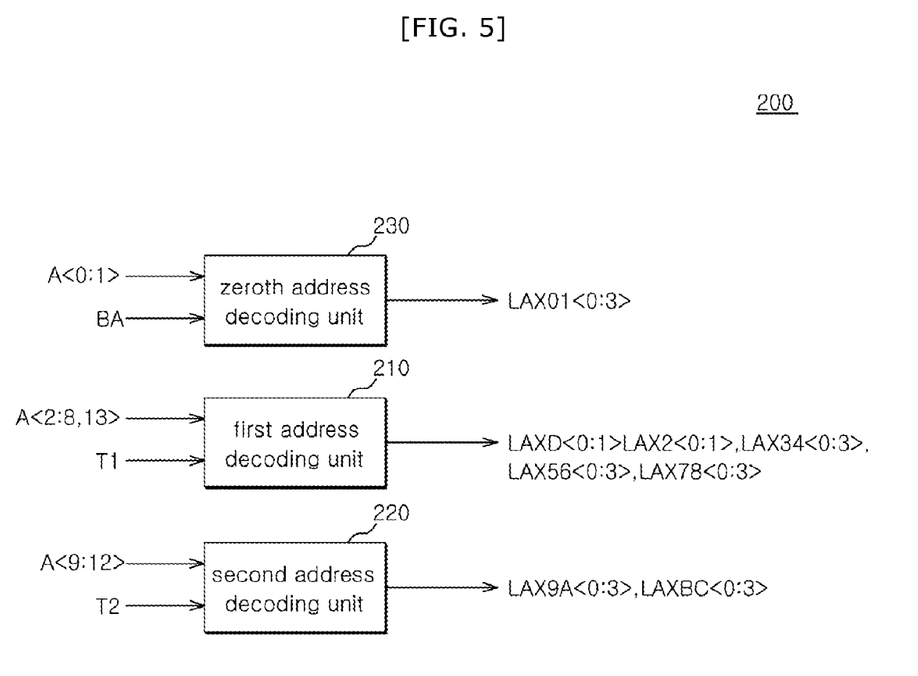
FIG. 5 is a block diagram illustrating in more detail a row predecoder included in the circuit shown in FIG. 2.

Referring to FIG. 5, the row predecoder 200 can comprise a first address decoding unit 210, a second address decoding unit 220 and a zeroth address decoding unit 230.

The row address 'A<0:13>' can be divided into the address bits 'A<0:1>' associated with decoding of sub wordlines, the address bits 'A<9:12>' associated with selection of mats, and the address bits 'A<2:8,13>' for activating main word lines, which are respectively provided to the zeroth address decoding unit 230, the second address decoding unit 220 and the first address decoding unit 210.

Thus, the first address decoding unit 210 can be configured to decode address bits 'A<2:8,13>' in response to the first test signal 'T1', and to generate the address decoding signals 'LAXD<0:1>', 'LAX2<0:1>', 'LAX34<0:3>', 'LAX56<0:3>' and 'LAX78<0:3>'.

The second address decoding unit 220 can be configured to decode the address bits 'A<9:12>' associated with selection of mats in response to the second test signal 'T2', and to generate the address decoding signals 'LAX9A<0:3>' and 'LAXBC<0:3>'.

The zeroth address decoding unit 230 can be configured to decode the address bits 'A<0:1>' associated with decoding of sub wordlines in response to the bank active signal 'BA, and to generate zeroth address decoding signal 'LAX01<0:3>'. The number of bits associated with the decoding of sub wordlines can vary depending upon a sub wordline coding pattern as in 1:4 or 1:8 as required by a particular embodiment.

When the first test signal 'T1' is enabled, the address decoding signals 'LAX2<0:1>', 'LAX34<0:3>', 'LAX56<0:3>', 'LAX78<0:3>' and 'LAXD<0:1>' are disabled. When the first test signal 'T1' is disabled, the first address decoding unit 210 decodes the address bits 'A<2:8,13>', and generates the address decoding signals 'LAX2<0:1>', 'LAX34<0:3>', 'LAX56<0:3>', 'LAX78<0:3>' and 'LAXD<0:1>'. When the second test signal 'T2' is enabled, the address decoding signals 'LAX9A<0:3>' and 'LAXBC<0:3>' are disabled. When the second test signal 'T2' is disabled, the second address decoding unit 220 decodes the address bits 'A<9:12>' associated with selection of mats and generates the second address decoding signals 'LAX9A<0:3>' and 'LAXBC<0:3>'.

Here, the decoding signal 'LAX01<0:3>' can be provided to a sub wordline driver. In other words, in response to the zeroth address decoding signals 'LAX01<0:3>', certain wordlines associated with memory banks 0, 1, ... 7 can be activated. For example, in a ¼ wordline test, ¼ of the wordlines in a particular memory bank can be activated in response to decoding signal 'LAX01<0:3>'.

Referring again to FIG. 2, the wordline driving section 300 can receive address decoding signals 'LAX2<0:1>', 'LAX34<0:3>', 'LAX56<0:3>', 'LAX78<0:3>' and 'LAXD<0:1>' and address decoding signals 'LAX9A<0:3>' and 'LAXBC<0:3>'. Wordline decoding section 300 can be configured to then drive certain wordlines based on the address decoding signals and in response to the second test signal 'T2'.

Figure 6:
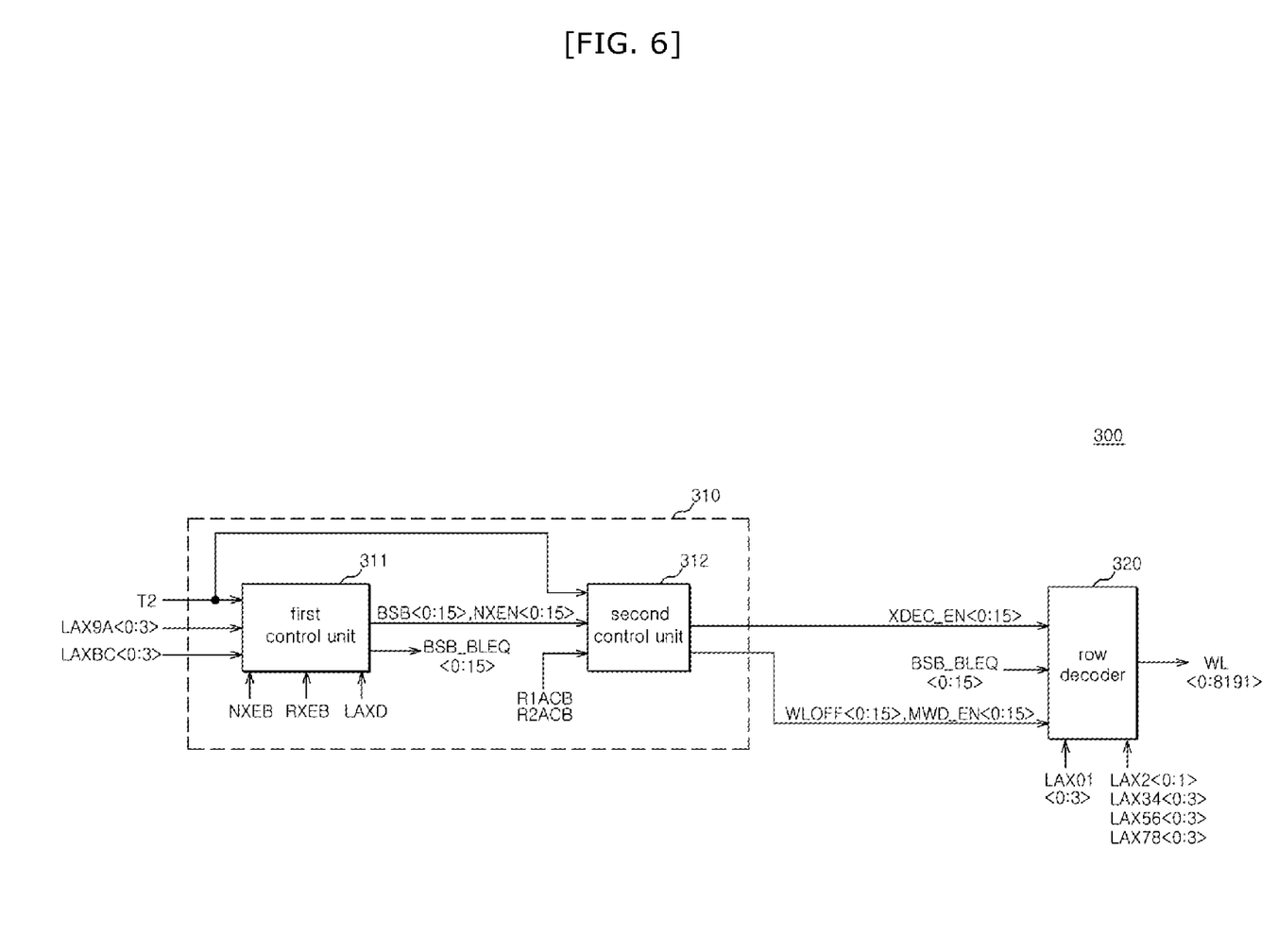
FIG. 6 is a block diagram illustrating in more detail a wordline driving section included in the circuit shown in FIG. 2.

Referring to FIGS. 2 and 6, the wordline driving section 300 can include a row decoder control unit 310 and a row decoder 320. The row decoder control unit 310 can receive the address decoding signals 'LAX9A<0:3>' and 'LAXBC<0:3>' in response to the second test signal 'T2', and generate a plurality of wordline control signals 'MWD_DRV<0:15>'. As shown in FIG. 6, the plurality of wordline control signals 'MWD_DRV<0:15>' can, depending on the embodiment, be divided into a wordline off control signals 'WLOFF<0:15>', row decoder enable signals 'XDEC_EN<0:15>', and main wordline enable signals 'MWD_EN<0:15>'.

The row decoder control unit 310 can comprise a first control unit 311 and a second control unit 312. As illustrated FIG. 7, the first control unit 311 can receive address decoding signals 'LAX9A<0:3>' and 'LAXBC<0:3>', a normal row enable signal 'NXEB', a redundancy row enable signal 'RXEB' and an address decoding signal 'LAXD' in response to the second test signal 'T2', and generates normal mat select signals 'NXEN<0:15>', mat select bitline equalization signals 'BSB_BLEQ<0:15>' and mat select signals 'BSB<0:15>'.

Figure 7:
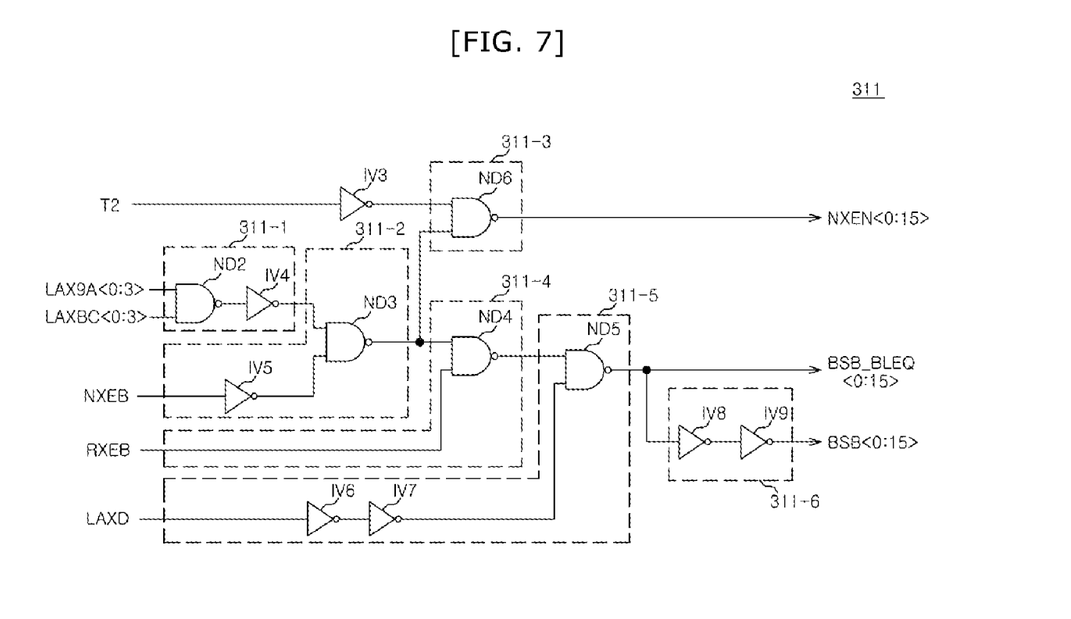
FIG. 7 is a detailed circuit diagram illustrating in more detail a first control unit included in the wordline driving section shown in FIG. 6.

The normal row enable signal 'NXEB' can be a signal that is at a low level in a normal state and is at a high level in a redundancy state, depending upon the fuse cutting information of a redundancy circuit. Contrastingly, the redundancy row enable signal 'RXEB' can be a signal that goes low when the redundancy circuit is selected and goes high when a normal circuit is selected.

The mat select bitline equalization signals 'BSB_BLEQ<0:15>' can be signals that control a bitline equalizing circuit or a precharging circuit in a corresponding mat.

The mat select signals 'BSB<0:15>' can be signals that delay the mat select bitline equalization signals 'BSB_BLEQ<0:15>' and select activation or inactivation of the corresponding mat.

The address decoding signal 'LAXD' can be a signal obtained by predecoding the thirteenth address bit 'A13'. For example, in the case of a 32 mat structure, the address decoding signal 'LAXD' can serve as a signal that divides 32 mats into (respectively 16) up mats and down mats.

The first control unit 311 can comprise address discriminator 311-1, normal selector 311-2, test signal transmitter 311-3, redundancy selector 311-4, up and down mat selectors 311-5, and delayer 311-6. The first control unit 311 can be provided for each mat.

The address discriminator 311-1 can be configured to receive and decode the address decoding signals 'LAX9A<0:3>' and 'LAXBC<0:3>'. The address discriminator 311-1 can comprise a second NAND gate ND2 configured to receive the address decoding signals 'LAX9A<0:3>' and 'LAXBC<0:3>' and a fourth inverter IV4, which inverts the output of the second NAND gate ND2.

The second address decoding signals 'LAX9A<0:3>' and 'LAXBC<0:3>' are signals that are obtained by decoding the address bits 'A<9:12>' associated with the selection of mats. For example, if the address bits associated with selection of mats are 4 bits, then the address decoding signals 'LAX9A<0:3>' and 'LAXBC<0:3>' can be generated by decoding the address bits 'A<9:12>'.

The normal selector 311-2 can be configured to receive the normal row enable signal 'NXEB' and the output of the address discriminator 311-1, and to generate an output signal based thereon. The normal selector 311-2 can comprise a fifth inverter IV5, which inverts the normal row enable signal 'NXEB', and a third NAND gate ND3, which receives the output of the fifth inverter IV5 and the output of the address discriminator 311-1 and executes a NANDing operation.

The redundancy selector 311-4 can be configured to receive the redundancy row enable signal 'RXEB' and the output signal of the normal selector 311-2, and to generate an output signal based thereon. The redundancy selector 311-4 can comprise a fourth NAND gate ND4, which receives the output of the normal selector 311-2 and the redundancy row enable signal 'RXEB' and executes a NANDing operation.

The test signal transmitter 311-3 can receive the second test signal 'T2' and the output signal of the normal selector 311-2, and generate the normal mat select signals 'NXEN<0:15>'. The test signal transmitter 311-3 can comprise a third inverter IV3 and a sixth NAND gate ND6. The third inverter IV3 inverts the second test signal 'T2'. The sixth NAND gate ND6 receives the output of the third inverter IV3 and the output signal of the normal selector 311-2 and executes a NANDing operation.

The up and down mat selector 311-5 can receive the address decoding signal 'LAXD' and the output signal of the redundancy selector 311-4, and generate the mat select bitline equalization signals 'BSB_BLEQ<0:15>'. The up and down mat selector 311-5 can comprise an even number of inverters IV6 and IV7 and a fifth NAND gate ND5. The even number of inverters IV6 and IV7 function to delay the address decoding signal 'LAXD'. The fifth NAND gate ND5 receives the output of the seventh inverter IV7 and the output of the redundancy selector 311-4 and executes a NANDing operation.

The delayer 311-6 can receive the mat select bitline equalization signals 'BSB_BLEQ<0:15>', delay the mat select bitline equalization signals 'BSB_BLEQ<0:15>' for a preset time, and generate the mat select signals 'BSB<0:15>'. The delayer 311-6 can comprise an even number of inverters IV8 and IV9.

The operations of the first control unit 311 will be described below.

In the multi-wordline test mode, the second test signal 'T2' has a low level, the normal row enable signal 'NXEB' has a low level, and the redundancy row enable signal 'RXEB' has a high level. Accordingly, if the bits of address decoding signals 'LAX9A<0:3>' and 'LAXBC<0:3>' are at a high level, then the output of the address discriminator 311-1 in the corresponding mat goes high as well. Since the normal row enable signal 'NXEB' is at a low level, the output of the normal selector 311-2 goes low as the output of the third NAND gate ND3 goes low.

Also, in the multi-wordline test mode, as the redundancy row enable signal 'RXEB' goes high, the output of the redundancy selector 311-4 goes high. Further, because the address decoding signal 'LAXD', which is sent to the activated mat, is at a high level, the output of the up and down mat selector 311-5 will be high. Accordingly, the bits of the mat select bitline equalization signal 'BSB_BLEQ<0:15>' and the mat select signal 'BSB<0:15>' will go low.

Moreover, in the multi-wordline test mode, since the second test signal 'T2' is at a low level, the bits of the normal mat select signal 'NXEN<0:15>' will go high.

Thus, the first control unit 311 included in the mat, which corresponds to the second address decoding signals 'LAX9A<0:3>' and 'LAXBC<0:3>', outputs a normal mat select signal 'NXEN<i>' having a high level, a mat select bitline equalization signal 'BSB_BLEQ<i>' having a low level, and a mat select signal 'BSB<i>' having a low level.

In the normal operation mode and the multi-wordline test mode, when the second test signal 'T2' and the normal row enable signal 'NXEB' go low, the redundancy row enable signal 'RXEB' goes high, and the bits of the normal mat select signal 'NXEN<0:15>', which are enabled or disabled depending upon the level of the address decoding signals 'LAX9A<0:3>' and 'LAXBC<0:3>', are generated accordingly. In other words, only the mat that corresponds to the row address information, is activated.

Also, when not in the normal operation mode, the first control unit 311 outputs the normal mat select signal 'NXEN<0:15>'; the bits of which are fixed irrespective of the level of the address decoding signals 'LAX9A<0:3>' and 'LAXBC<0:3>'.

When the second test signal 'T2' is at a high level, the output signal of the third inverter IV3 will go low and be passed to the sixth NAND gate ND6 of the test signal transmitter 311-3. The bits of the normal mat select signal 'NXEN<0:15>' will then be high irrespective of the levels of the address decoding signals 'LAX9A<0:3>' and 'LAXBC<0:3>' and the normal row enable signal 'NXEB'.

In certain embodiments, in the multi-wordline test, only the normal mat select signal 'NXEN<i>' (i is an integer number between 1 and 16) sent to a specified mat among the mats in one memory bank, as dictated by the address decoding signals 'LAX9A<0:3>' and 'LAXBC<0:3>', goes high. Hence, the multi-wordline test can be performed only for the specified mat and not performed for the other mats.

Since the bits of the mat select bitline equalization signal 'BSB_BLEQ<0:15>' and the mat select signal 'BSB<0:15>' are enabled or disabled in response to the address decoding signals 'LAX9A<0:3>' and 'LAXBC<0:3>', the mat select bitline equalization signals 'BSB_BLEQ<0:15>' and the mat select signals 'BSB<0:15>', which are inputted to the mat specified by address decoding signals 'LAX9A<0:3>' and 'LAXBC<0:3>', goes low, and the signals sent to the other mats goes high.

Figure 8:
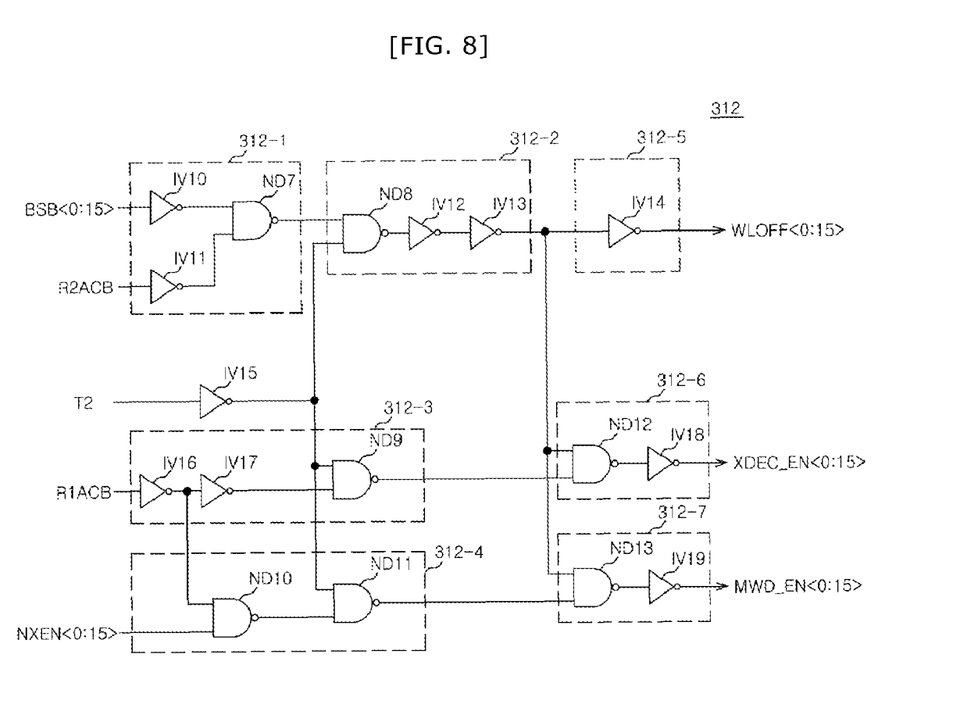
FIG. 8 is a detailed circuit diagram illustrating in more detail a second control unit included in the wordline driving section shown in FIG. 6.

Referring to FIG. 8, the second control unit 312 can be configured to receive the mat select signal 'BSB<0:15>', a first precharge signal 'R1ACB', a second precharge signal 'R2ACB' and the normal mat select signal 'NXEN<0:15>' in response to the second test signal 'T2', and to generate the wordline off control signals 'WLOFF<0:15>', the row decoder enable signal 'XDEC_EN<0:15>', and the main wordline enable signal 'MWD_EN<0:15>'.

The first precharge signal 'R1ACB' is a signal that goes low in an active mode and goes high in a precharging mode, and can be a signal that is obtained by inverting the bank active signal 'BA'.

The second precharge signal 'R2ACB' can be a signal that goes low in the active mode and goes high when a preset time elapses after entering the precharging mode, and can be a signal that is obtained by delaying the inverted bank active signal 'BA'.

The second control unit 312 can comprise a first precharging controller 312-1, second precharging controller 312-4, third precharging controller 312-3, test signal controller 312-2, inversion delayer 312-5, row decoder signal generator 312-6, and a wordline enable signal generator 312-7.

The first precharging controller 312-1 can receive the second precharge signal 'R2ACB' and the mat select signal 'BSB<0:15>', and generate an output signal based thereon. In the active mode, when the second precharge signal 'R2ACB' is low, the first precharging controller 312-1 will output the same logic value as the bits of the mat select signal 'BSB<0:15>'.

The second precharging controller 312-4 can receive the inverted first precharge signal 'R1ACB', the inverted second test signal 'T2' and the normal mat select signals 'NXEN<0:15>', and generate an output signal based thereon. In the active mode and also in the multi-wordline test mode, since the second test signal 'T2' and the first precharge signal 'R1ACB' are both low, the output of the second precharging controller 312-4 will be determined based on the level of the bits of the normal mat select signal 'NXEN<0:15>'. In the precharging operation mode, since the first precharge signal 'R1ACB' is high, the second precharging controller 312-4 outputs a low level signal without being changed depending upon the level of the bits of the normal mat select signals 'NXEN<0:15>'.

The third precharging controller 312-3 can receive the second test signal 'T2' and the first precharge signal 'R1ACB', and generate an output signal based thereon. In the multi-wordline test mode, because the second test signal 'T2' is low, the output signal of the third precharging controller 312-3 is determined based on the level of the first precharge signal 'R1ACB'.

The test signal controller 312-2 can receive the inverted second test signal 'T2' and the output of the first precharging controller 312-1, and generate an output based thereon. In the multi-wordline test mode, since the second test signal 'T2' is low, the test signal controller 312-2 outputs the inverted level of the output of the first precharging controller 312-1. When the second test signal 'T2' is high, the output signal of the test signal controllers 312-2 is not changed by the output of the first precharging controller 312-1 and is fixed at a high level.

The inversion delayer 312-5 inverts the output of the test signal controller 312-2 and outputs the wordline off control signal 'WLOFF<0:15>'.

The row decoder signal generator 312-6 receives the output of the third precharging controller 312-3 and the output of the test signal controller 312-2, and generates the row decoder enable signal 'XDEC_EN<0:15>'.

The wordline enable signal generator 312-7 receives the output of the second precharging controller 312-4 and the output of the test signal controller 312-2, and generates the main wordline enable signal 'MWD_EN<0:15>'.

The detailed configuration of the second control unit 312 as mentioned above will be described in more detail below.

Still referring to FIG. 8, the first precharging controller 312-1 comprises a tenth inverter IV10, an eleventh inverter IV11 and a seventh NAND gate ND7. The tenth inverter IV10 inverts the bits of the mat select signal 'BSB<0:15>'. The eleventh inverter IV11 inverts the second precharge signal 'R2ACB'. The seventh NAND gate ND7 receives the output of the tenth inverter IV10 and the output of the eleventh inverter IV11 and executes a NANDing operation.

The test signal controller 312-2 comprises an eighth NAND gate ND8, a twelfth inverter IV12, and a thirteenth inverter IV13. The eighth NAND gate ND8 receives the output signal of a fifteenth inverter IV15 and the output of the first precharging controller 312-1 and executes a NAND operation. The twelfth inverter IV12 inverts the output of the eighth NAND gate ND8. The thirteenth inverter IV13 inverts the output of the twelfth inverter IV12.

The third precharging controller 312-3 can comprise a sixteenth inverter IV16, a seventeenth inverter IV17, and a ninth NAND gate ND9. The sixteenth inverter IV16 can be configured to invert the first precharge signal 'R1ACB'. The seventeenth inverter IV17 can be configured to invert the output of the sixteenth inverter IV16. The ninth NAND gate ND9 can receive the output of the fifteenth inverter IV15 and the output of the seventeenth inverter IV17 and execute a NANDing operation.

The second precharging controller 312-4 can comprise a tenth NAND gate ND10 and an eleventh NAND gate ND11. The tenth NAND gate ND10 can receive the normal mat select signal 'NXEN<0:15>' and the output of the sixteenth inverter IV16 and execute a NANDing operation. The eleventh NAND gate ND11 can receive the output of the tenth NAND gate ND10 and the output of the fifteenth inverter IV15 and execute a NANDing operation.

The inversion delayer 312-5 can comprise a fourteenth inverter IV14. The fourteenth inverter IV14 inverts the output of the test signal controller 312-2 and outputs the wordline off control signal 'WLOFF<0:15>'.

The row decoder signal generator 312-6 can comprise a twelfth NAND gate ND12 and en eighteenth inverter IV18. The twelfth NAND gate ND12 can receive the output of the test signal controller 312-2 and the output of the third precharging controller 312-3 and execute a NANDing operation. The eighteenth inverter IV18 inverts the output of the twelfth NAND gate ND12 and outputs the row decoder enable signal 'XDEC_EN<0:15>'.

The wordline enable signal generator 312-7 can comprise a thirteenth NAND gate ND13 and a nineteenth inverter IV19. The thirteenth NAND gate ND13 can receive the output of the test signal generator 312-2 and the output of the second precharging controller 312-4 and execute a NANDing operation. The nineteenth inverter IV19 inverts the output of the thirteenth NAND gate ND13 and outputs the main wordline enable signal 'MWD_EN<0:15>'.

Thus, when in the multi-wordline test mode, the second test signal 'T2' goes low, and the output of the fifteenth inverter IV15 goes high. Accordingly, the eighth, ninth and eleventh NAND gates ND8, ND9 and ND11, which receive the output of the fifteenth inverter IV15, function as inverters, and have output levels that are obtained by inverting the input values of the respective NAND gates ND8, ND9 and ND11 in addition to the output of the fifteenth inverter IV15. Therefore, if the second test signal 'T2' is low, the bits of the wordline off control signal 'WLOFF<0:15>', the row decoder enable signal 'XDEC_EN<0:15>' and the main wordline enable signal 'MWD_EN<0:15>' are activated or inactivated depending upon the bits of the mat select signal 'BSB<0:15>', the second precharging signal 'R2ACB', the first precharging signal 'R1ACB', and the normal bits of the mat select signal 'NXEN<0:15'.

Also, if the second test signal 'T2' is at a high level, then the output of the fifteenth inverter IV15 goes low, and all the outputs of the eighth NAND gate ND8, the ninth NAND gate ND9 and the eleventh NAND gate ND11 go high. Thus, the wordline off control signal 'WLOFF<0:15>' go low, the bits of the row decoder enable signal 'XDEC_EN<0:15>' go high, and the bits of the main wordline enable signal 'MWD_EN<0:15>' go high.

Referring again to FIGS. 2 and 5, the row decoder 320 receives the address decoding signals 'LAX01<0:3>', the address decoding signals 'LAX2<0:1>', 'LAX34<0:3>', 'LAX56<0:3>', 'LAX78<0:3>' and 'LAXD<0:1>' and the output of the row decoder control unit 310, and generates sub wordline signal 'SWL<0:8191>' therefrom.

The row decoder 320 can comprise a main wordline driver and a sub wordline driver that are driven by receiving the output of the row decoder control unit 310. For example, the row decoder 320 can comprise a main wordline driver that receives the wordline control signal 'MWD_DRV<0:15>', etc., and a sub wordline driver that receives the output of the main wordline driver and sub wordline decoding signals and activates corresponding wordlines.

Referring to FIGS. 2-8, in the multi-wordline test, the multi-wordline test signal 'T1NWL' is enabled. Also, in the case of the active mode, since the bank active signal 'BA' is enabled, the first test signal 'T1' goes high. Further, since the multi-wordline test signal 'T1NWL' is high, the second test signal 'T2' goes low.

Therefore, the second address decoding unit 220, which receives with the second test signal 'T2', decodes the address bits 'A<9:12>' associated with selection of mats and outputs the address decoding signals 'LAX9A<0:3>' and 'LAXBC<0:3>'. For example, if the addresses associated with selection of mats are 4 bits, the number of the address decoding signals 'LAX9A<0:3>' and 'LAXBC<0:3>', which are obtained by decoding the 4 bits, becomes 16. Only one bit among the bits of address decoding signals 'LAX9A<0:3>' and 'LAXBC<0:3>' goes high, and the remaining bits of the address decoding signals 'LAX9A<0:3>' and 'LAXBC<0:3>', which sent to the other mats, go low.

Further, the first address decoding unit 210, receives the first test signal 'T1' of a high level, inactivates all the address decoding signals 'LAX2<0:1>', 'LAX34<0:3>', 'LAX56<0:3>', 'LAX78<0:3>' and 'LAXD<0:1>', which are obtained by decoding bits 'A<2:8,13>'.

When the first test signal 'T1' is high, the bits of address decoding signals 'LAX2<0:1>', 'LAX34<0:3>', 'LAX56<0:3>', 'LAX78<0:3>' and 'LAXD<0:1>' go high. Accordingly, the row decoder control unit 310, which receives the second test signal 'T2' of a low level, inactivates only the bits of the wordline off control signal 'WLOFF<0:15>' that correspond to the mat specified by the address decoding signals 'LAX9A<0:3>' and 'LAXBC<0:3>', as in the normal mode, and activates the bits of the wordline off control signals 'WLOFF<0:15>' associated with the other mats. Also, the wordline driving section 300, which receives the wordline off control signal 'WLOFF<0:15>', activates only the wordlines in the corresponding mat, and inactivates the wordline of the mats that receive the activated wordline off controls signals 'WLOFF'. Therefore, the multi-wordline test is performed for the specified mat, and is not performed for the other mats.

By generating the multi-test signals 'T1' and 'T2', in the multi-wordline test mode, the multi-wordline test is performed only for the specified mat. Since the multi-wordline test is not performed for the other mats excluding the specified mat, power consumption can be decreased.

Figure 9:
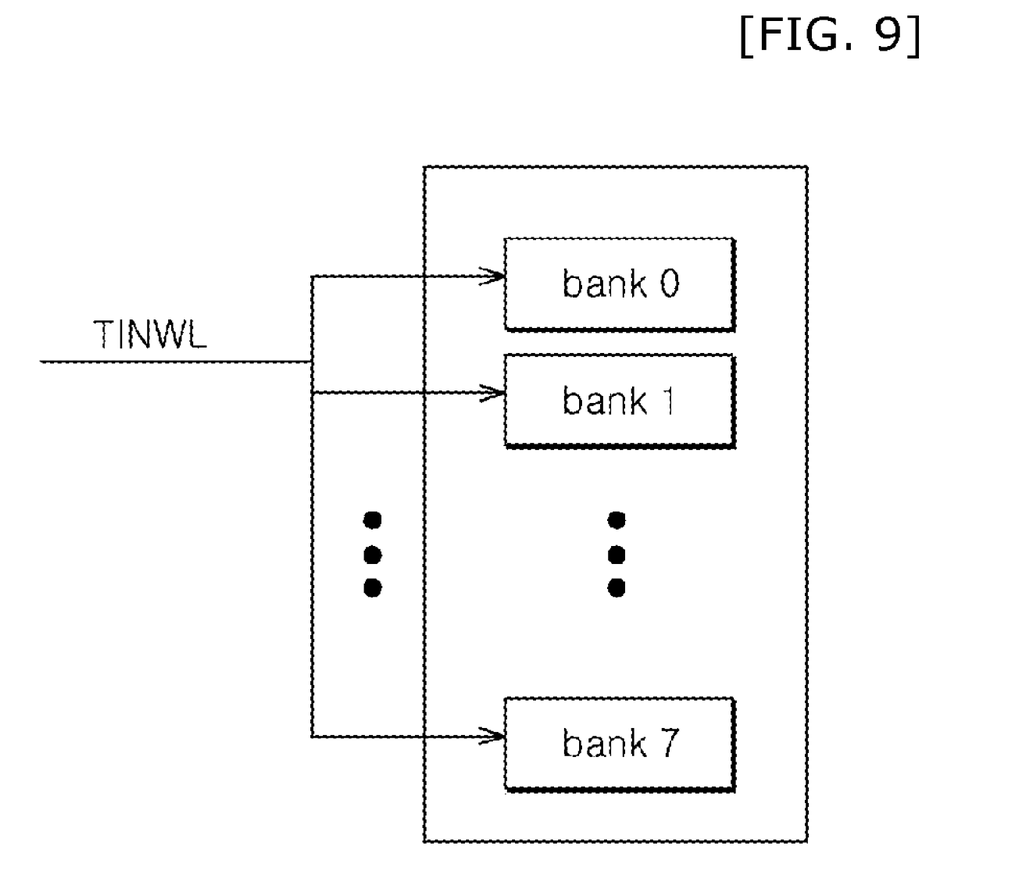
FIG. 9 is a block diagram illustrating a plurality of memory banks that can be controlled using the multi-wordline test control circuit shown in FIG. 2.

FIG. 9 illustrates a relationship between the multi-test control block 100 and a plurality of memory banks. Referring to FIG. 9, the multi-wordline test signal 'T1NWL' is sent to each of the plurality of memory banks 0, 1, . . . 7, which are respectively receive the bank enable signals 'BA0' through 'BA7'. Each of the banks performs the test in a selective manner by each of multi-test control blocks which receive the respective bank enable signals 'BA0' through 'BA7'. The first test signal 'T1' for the multi-wordline test is provided only to a selected (activated) bank. As a consequence, power consumption is decreased. For example, when assuming that a semiconductor integrated circuit has 8 banks and each bank has 16 cell mats, by conducting the test as described herein, power consumption is decreased to $1/128$. While the block diagram shown in FIG. 9 has 8 banks for the sake of convenience in explanation, it is to be noted that the number of banks and the number of mats are not necessarily so limited.

While the embodiments described herein are described in a manner such that the row addresses are decoded by predecoding 1 to 2 bits in accordance with a specified sequence and by then implementing a decoding operation, it is to be noted that the embodiments described herein are not limited to this decoding scheme and can be embodied in a variety of ways in respect of the number of bits and the decoding sequence of addresses.

While the embodiments described herein are described in a manner such that a sub wordline driving method is exemplified it is to be noted that wordlines are activated in a wordline driving method.

Also, when a specified memory bank is in the active mode, the corresponding sub wordlines are activated. In the meanwhile, in the precharging mode, when the sub wordlines are inactivated, the test mode is not ended, and next sub wordlines are activated by a subsequent bank active command. Therefore, even without ending the test mode, the sub wordlines of a next section can be tested in the multi-wordline test. Accordingly, it is possible to eliminate or reduce noise and to decrease power consumption.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A multi-wordline test control circuit for a semiconductor integrated device, for performing a multi-wordline test, comprising:
a multi-test control block configured to generate a first test signal and a second test signal in response to a multi-wordline test signal and a bank active signal; and
a multi-wordline test block coupled with the multi-test control block, the multi-wordline test block configured to perform the multi-wordline test in a specified cell mat among a plurality of cell mats in response to the first test signal and the second test signal.

2. The multi-wordline test control circuit according to claim 1, wherein the multi-test control block comprises:
a first test signal generation unit configured to generate the first test signal in response to the multi-wordline test signal and the bank active signal; and
a second test signal generation unit configured to generate the second test signal in response to the first test signal or the multi-wordline test signal.

3. The multi-wordline test control circuit according to claim 2, wherein the first test signal generation unit generates the first test signal, which is enabled when both the multi-wordline test signal and the bank active signal are enabled.

4. The multi-wordline test control circuit according to claim 2, wherein the second test signal is always at a low voltage level.

5. The multi-wordline test control circuit according to claim 2, wherein the second test signal generation unit includes an inverter configured to invert the multi-wordline test signal or the first test signal and to output the second test signal.

6. The multi-wordline test control circuit according to claim 1, wherein the multi-wordline test block further comprises:
a row predecoder configured to receive row addresses in response to the first test signal and the second test signal and to output first address decoding signals and second address decoding signals; and
a wordline driving section coupled with the row predecoder and wordlines, the wordline driving section configured to receive the first address decoding signals and the second address decoding signals in response to the second test signal and to drive the wordlines.

7. The multi-wordline test control circuit according to claim 6, wherein the row predecoder comprises:
a first address decoding unit configured to decode some bits of the row addresses in response to the first test signal and to generate the first address decoding signals; and
a second address decoding unit configured to decode bits of the row addresses associated with selection of mats in response to the second test signal and generate the second address decoding signals.

8. The multi-wordline test control circuit according to claim 7, wherein the row predecoder further comprises:
a zeroth address decoding unit configured to decode bits of the row addresses associated with decoding of sub wordlines in response to the bank active signal and to generate zeroth address decoding signals.

9. The multi-wordline test control circuit according to claim 7, wherein, when the first test signal is enabled, the first address decoding unit is configured to generate the first address decoding signals all of which are disabled, and when the first test signal is disabled, the first address decoding unit is configured to decode the received addresses and generate the first address decoding signals.

10. The multi-wordline test control circuit according to claim 7, wherein, when the second test signal is enabled, the second address decoding unit is configured to disable the second address decoding signals, and when the second test signal is disabled, the second address decoding unit is configured to decode bits of the row addresses associated with selection of mats and to generate the second address decoding signals.

11. The multi-wordline test control circuit according to claim 6, wherein the wordline driving section comprises:

a row decoder control unit configured to receive the second address decoding signals in response to the second test signal and to generate a plurality of wordline control signals; and a row decoder coupled with the row decoder control unit, the row decoder configured to receive the first address decoding signals and a partial output of the row decoder control unit and to drive the wordlines.

12. The multi-wordline test control circuit according to claim 11, wherein the plurality of wordline control signals comprise at least one of wordline off control signals, row decoder enable signals, and main wordline enable signals.

13. The multi-wordline test control circuit according to claim 11, wherein, when the second test signal is disabled, the row decoder control unit is configured to receive the second address decoding signals, disable the wordline off control signals of mats corresponding to the second address decoding signals, and activate the wordline off control signals of the other mats.

14. The multi-wordline test control circuit according to claim 13, wherein the row decoder control unit comprises:
a first control unit configured to receive the second address decoding signals, a normal row enable signal, a redundancy row enable signal and an address decoding signal in response to the second test signal and to generate normal mat select signals, mat select bitline equalization signals and mat select signals; and
a second control unit coupled with the first control unit, the second control unit configured to receive the mat select signals, a first precharge signal, a second precharge signal and the normal mat select signals in response to the second test signal and to generate the wordline off control signals, the row decoder enable signals and the main wordline enable signals.

15. The multi-wordline test control circuit according to claim 14, wherein the first control unit comprises:
an address discriminator configured to receive and decode the second address decoding signals;
a normal selector configured to receive the normal row enable signal and an output of the address discriminator; and
a test signal transmitter configured to receive the second test signal and an output of the normal selector and to generate the normal mat select signals.

16. The multi-wordline test control circuit according to claim 15, wherein the first control unit further comprises:
a redundancy selector configured to receive the redundancy row enable signal and the output of the normal selector; and
an up and down mat selector configured to receive the address decoding signal and an output of the redundancy selector and to generate the mat select bitline equalization signals.

17. The multi-wordline test control circuit according to claim 16, wherein the first control unit further comprises:
a delayer configured to receive the mat select bitline equalization signals and to output the mat select signals.

18. The multi-wordline test control circuit according to claim 14, wherein the second control unit comprises:
a first precharging controller configured to receive the second precharge signal and the mat select signals;
a second precharging controller configured to receive the first precharge signal, the second test signal and the normal mat select signals;
a third precharging controller configured to receive the second test signal and the first precharge signal;

a test signal controller configured to transmit an output of the first precharging controller in response to the second test signal; and
an inversion delayer configured to invert an output of the test signal controller and to output the wordline off control signals.

19. A method for controlling a multi-wordline test control circuit, comprising the steps of:
generating a first test signal when a multi-wordline test signal is activated and a bank active signal is activated;
deactivating a second test signal when the first test signal is activated;
receiving some of a plurality of row addresses in response to the activated first test signal and deactivating first address decoding signals;
generating second address decoding signals by decoding addresses associated with selection of mats among the row addresses in response to the deactivation of the second test signal such that only the second address decoding signals inputted to mats corresponding to the addresses associated with selection of mats are activated, and the second address decoding signals inputted to the other mats are deactivated;
receiving the second address decoding signals and the second test signal and generating wordline off control signals for controlling a wordline driver; and
receiving the first address decoding signals and the wordline off control signals and activating word lines.

20. The method according to claim 19, wherein the step of generating the wordline off control signals comprises the steps of:
receiving the second address decoding signals, a normal row enable signal, a redundancy row enable signal and an address decoding signal in response to the second test signal and generating normal mat select signals, mat select bitline equalization signals and mat select signals; and
receiving the mat select signals, a first precharge signal, a second precharge signal and the normal mat select signals in response to the second test signal and generating the wordline off control signals, row decoder enable signals and main wordline enable signals.

21. A multi-wordline test control circuit comprising:
a first multi-test control block arranged in a first bank and configured to generate multi-wordline test signals for respective cell mats in the first bank in response to a first bank active signal;
a first multi-wordline test block coupled with the first multi-test control block and arranged in the first bank, and driven in response to the multi-wordline test signals for the respective cell mats in the first bank;
a second multi-test control block arranged in a second bank and configured to generate multi-wordline test signals for respective cell mats in the second bank in response to a second bank active signal; and
a second multi-wordline test block coupled with the first multi-test control block and arranged in the second bank, and driven in response to the multi-wordline test signals for the respective cell mats in the second bank,
wherein a multi-wordline test is performed for at least one of the banks or for at least one of the cell mats of the banks.

22. The multi-wordline test control circuit according to claim 21, wherein the first multi-test control block is configured to generate the multi-wordline test signals for the respective cell mats in the first bank in response to a first multi-wordline test signal and the first bank active signal, and wherein the multi-wordline test signals for the respective cell mats in the first bank includes a first test signal that is enabled when the first multi-wordline test signal and the first bank active signal are enabled, and a second test signal that is disabled when the first multi-wordline test signal is enabled.

23. The multi-wordline test control circuit according to claim 22, wherein the first multi-wordline test block comprises:
- a row predecoder configured to receive row addresses in response to the first test signal and the second test signal and to output first address decoding signals and second address decoding signals; and
- a wordline driving section coupled with the row predecoder, the wordline driving section configured to receive the first address decoding signals and the second address decoding signals in response to the second test signal and to drive wordlines.

24. The multi-wordline test control circuit according to claim 21, wherein the second multi-test control block is configured to generate the multi-wordline test signals for the respective second cell mats in response to a second multi-wordline test signal and the second bank active signal, and the multi-wordline test signals for the respective second cell mats includes a first test signal that is enabled when the second multi-wordline test signal and the second bank active signal are enabled, and a second test signal that is disabled when the second multi-wordline test signal is enabled.

25. The multi-wordline test control circuit according to claim 24, wherein the second multi-wordline test block comprises:
- a row predecoder configured to receive row addresses in response to the first test signal and the second test signal and to output first address decoding signals and second address decoding signals; and
- a wordline driving section coupled with the row predecoder, the wordline driving section configured to receive the first address decoding signals and the second address decoding signals in response to the second test signal and to drive wordlines.

* * * * *